United States Patent
Bolender

(10) Patent No.: US 9,600,084 B2
(45) Date of Patent: Mar. 21, 2017

(54) METHODS AND APPARATUS FOR CAPACITIVELY DETECTING KEY MOTION AND FINGER PRESENCE ON KEYBOARD KEYS

(71) Applicant: SYNAPTICS INCORPORATED, San Jose, CA (US)

(72) Inventor: Robert J. Bolender, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 356 days.

(21) Appl. No.: 14/150,824

(22) Filed: Jan. 9, 2014

(65) Prior Publication Data

US 2015/0193008 A1    Jul. 9, 2015

(51) Int. Cl.
  *G06F 3/02*    (2006.01)
(52) U.S. Cl.
  CPC .................. *G06F 3/0202* (2013.01)
(58) Field of Classification Search
  CPC ........ H03K 2217/96054; H03K 2217/960775; H03K 2217/96077; H03K 17/9622; H03K 17/975; H03K 17/962; H03K 17/98; H03K 2217/96015; H03K 17/955; H03K 17/9643; H03K 17/96; H03K 17/965; H01H 13/88; H01H 13/14; H01H 13/70; H01H 13/7065; H01H 2221/04; H01H 2221/036; H01H 2239/006; H01H 2215/042; H01H 13/7006; H01H 2025/048; G06F 3/0202; G06F 3/0205; G06F 3/0414; G06F 3/02; G06F 3/0234; G06F 2203/04105; G06F 2203/04106; B60K 2350/104; B60K 2350/1036
See application file for complete search history.

(56) References Cited

U.S. PATENT DOCUMENTS

| | | | |
|---|---|---|---|
| 4,651,133 A | 3/1987 | Ganesan et al. | |
| 5,675,361 A * | 10/1997 | Santilli | G06F 3/03547 345/156 |
| 6,204,836 B1 | 3/2001 | Yamazaki et al. | |
| 8,258,986 B2 | 9/2012 | Makovetskyy | |
| 2007/0091070 A1* | 4/2007 | Larsen | G06F 3/0213 345/168 |
| 2010/0148995 A1* | 6/2010 | Elias | G06F 3/0488 341/22 |
| 2011/0057899 A1* | 3/2011 | Sleeman | G01L 1/146 345/174 |
| 2012/0228111 A1* | 9/2012 | Peterson | H03K 17/962 200/600 |

(Continued)

FOREIGN PATENT DOCUMENTS

EP          0072784 A2     2/1983

*Primary Examiner* — Grant Sitta
*Assistant Examiner* — Amen Bogale
(74) *Attorney, Agent, or Firm* — Osha Liang LLP

(57) ABSTRACT

A keyboard including a plurality of key assemblies configured to be pressed by an input object. A subset of the plurality of key assemblies each includes a key cap and a first electrode pair underneath the key cap and configured to detect key motion in response to downward force applied by the input object. The key cap also includes a second electrode pair disposed underneath the key cap and configured to detect positional information about the input object interacting with the key cap.

19 Claims, 6 Drawing Sheets

(56) References Cited

U.S. PATENT DOCUMENTS

| | | | |
|---|---|---|---|
| 2013/0100030 A1* | 4/2013 | Los | G06F 3/023 |
| | | | 345/169 |
| 2013/0135211 A1 | 5/2013 | Chiang et al. | |
| 2014/0002358 A1* | 1/2014 | Bruwer | G05G 9/047 |
| | | | 345/158 |
| 2014/0062933 A1* | 3/2014 | Coulson | G06F 3/044 |
| | | | 345/174 |

* cited by examiner $F_1$: Peak Force
$F_2$: Contact Force
Snap Ratio = $(F_1-F_2)/(F_1)$

METHODS AND APPARATUS FOR CAPACITIVELY DETECTING KEY MOTION AND FINGER PRESENCE ON KEYBOARD KEYS

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

Presently known capacitive finger position sensors can produce ambiguous results. In particular, the response signal output by a typical capacitive finger position sensor initially dips below a baseline output value as the finger touches the key cap, and thereafter increases above the baseline value as the key cap is pressed downwardly. Consequently, conventional sensors cannot effectively discriminate between: i) a baseline output value due to finger presence during a keystroke; and ii) a baseline output value due to no finger being present. Systems and methods are thus needed which overcome this shortcoming.

BRIEF SUMMARY OF THE INVENTION

Methods and apparatus are provided for detecting both keystroke and finger presence on keyboard keys. Various embodiments provide a detection scheme for detecting a finger on a key cap in the un-pressed state as well as in the depressed state, by leveraging a separate keystroke sensor to disambiguate the finger presence sensor output signal. Specifically, if the finger presence sensor is at its baseline value and the keystroke sensor is also at its baseline value, the system reports that no finger is present on the key. Alternatively, if the finger presence sensor outputs its baseline value and the keystroke sensor is above its baseline value, the system reports that a finger is present on the key.

Moreover, the additional hardware for detecting finger presence may be efficiently implemented in the context of a keyboard having key assemblies which include a key cap configured to magnetically interact with a key guide to provide a return mechanism following a keystroke. In particular, the magnetic element associated with the key cap may be used to sense keystroke motion using an electrode pair positioned underneath the key cap. The keystroke electrode pair may share either a transmitter or receiver electrode with the electrode pair used to detect finger position, thereby minimizing the total number of electrodes needed to implement both the keystroke sensor pixels and the finger presence pixels.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprise other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
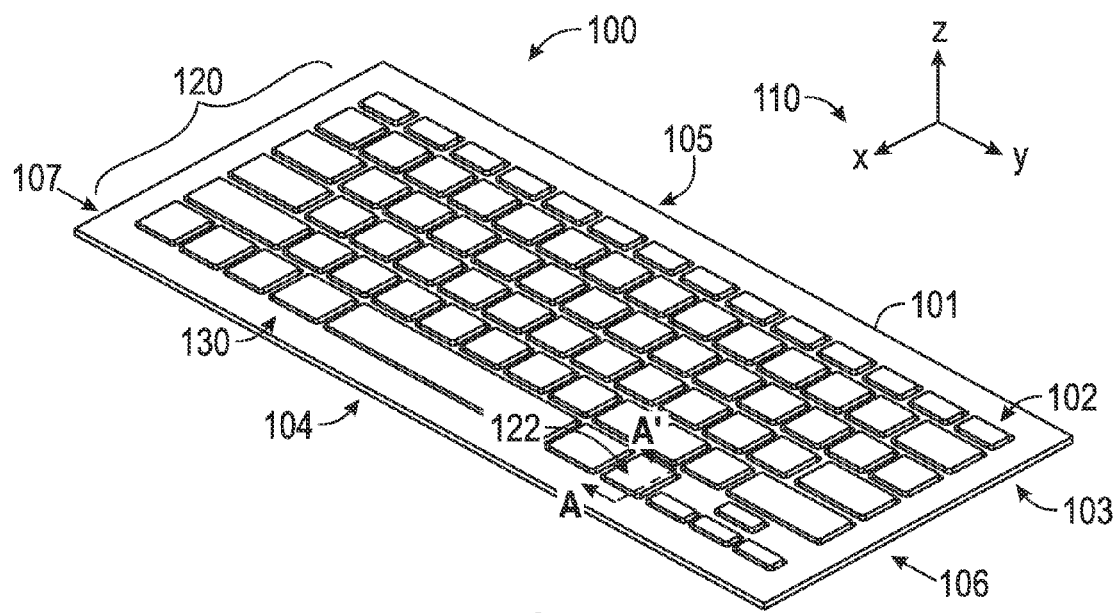
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into or coupled to computer such as a laptop computer comprising one or more processing systems. The processing system(s) each comprise one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
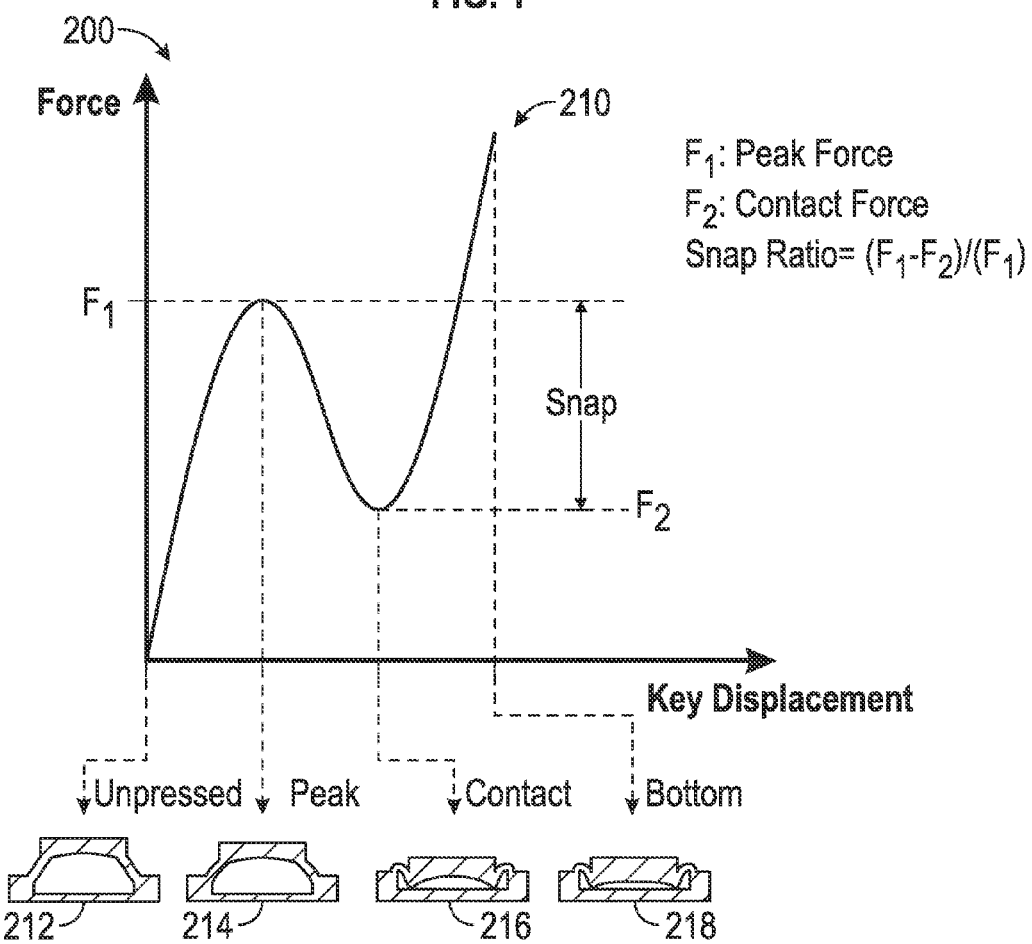
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
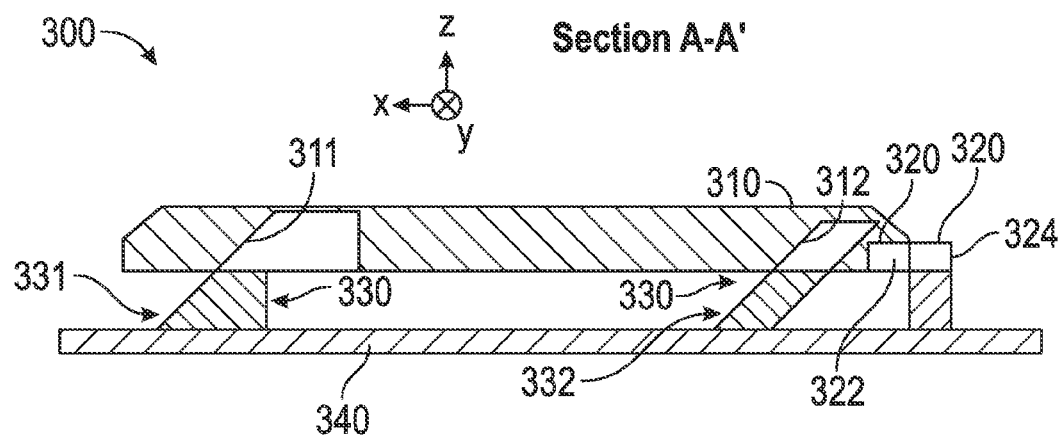
FIGS. 3A-3B are simplified side views of a first example touchsurface assembly configured in accordance with the techniques described herein.
Figure 3B:
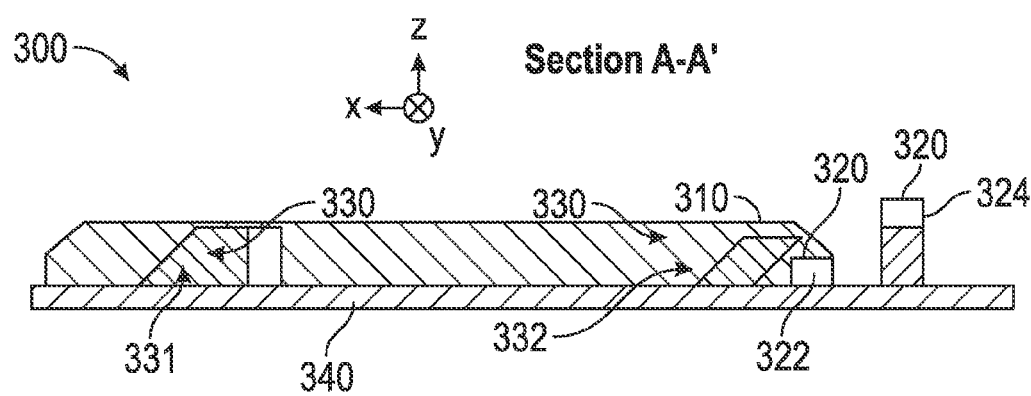

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 324 is physically attached to a bezel or base proximate to the keycap 310. The magnetically coupled component 322 is physically attached to the keycap and magnetically interacts with the magnetically coupled component 324. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
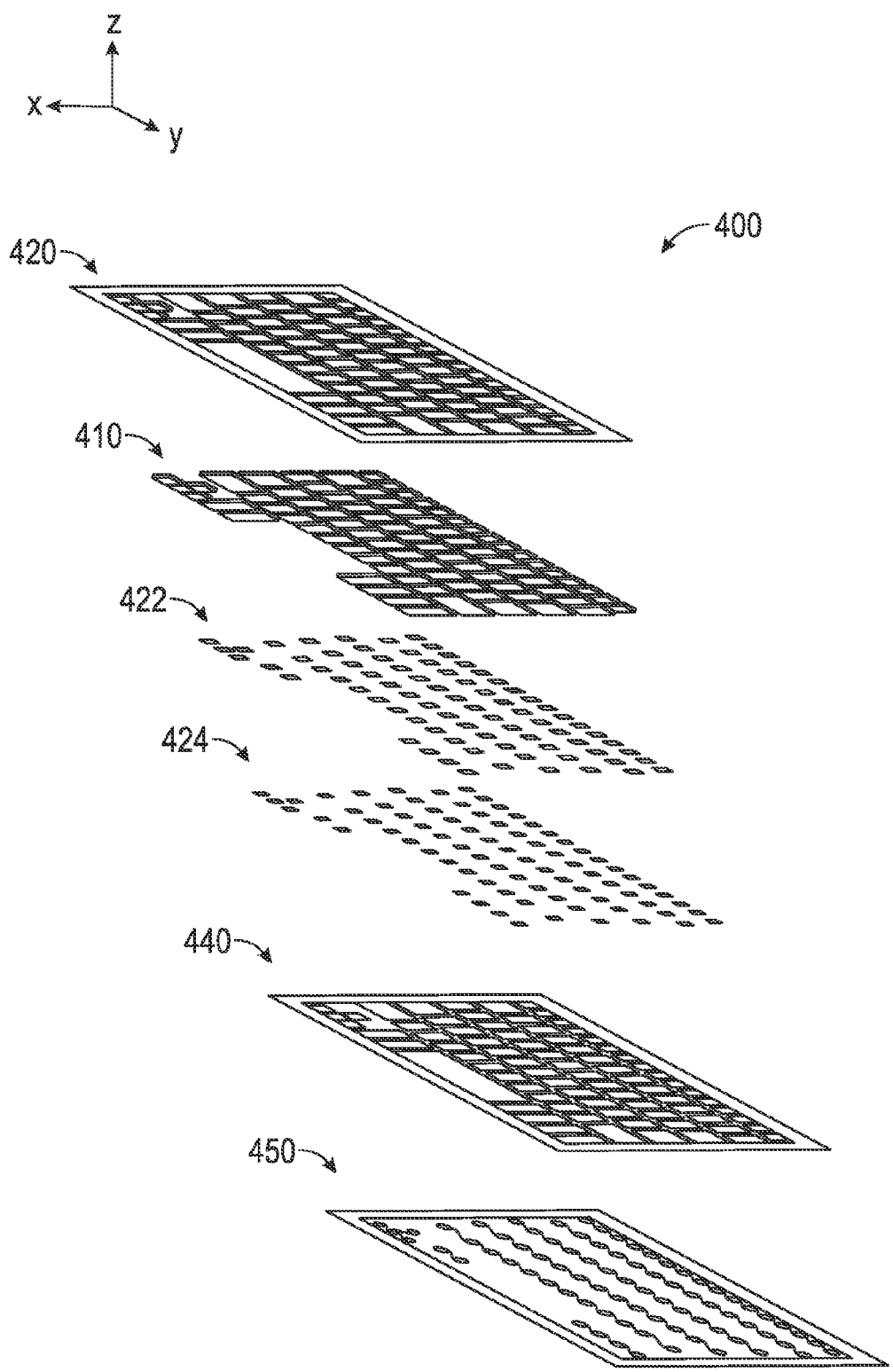
FIG. 4 shows an exploded view of an example keyboard in accordance with the techniques described herein.

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5:
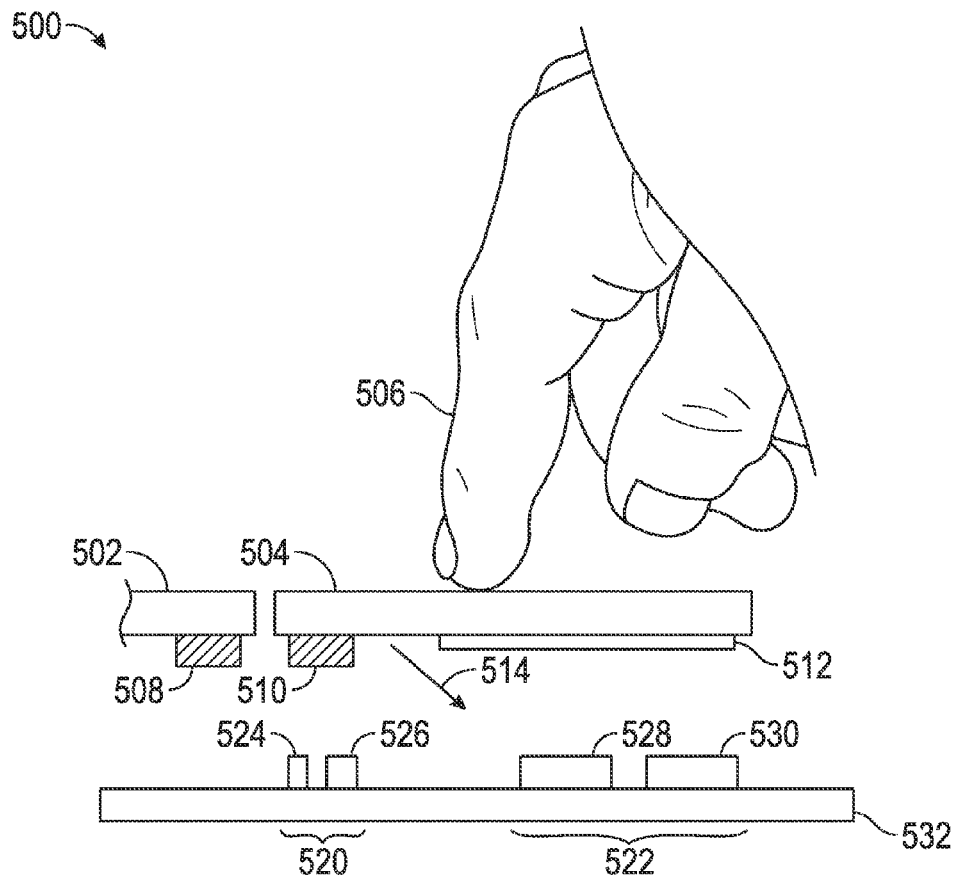
FIG. 5 is a schematic layout diagram of an exemplary key assembly including a stationary key guide, a movable key cap including a magnetic portion, a finger presence sensor, and a keystroke motion sensor in accordance with the techniques described herein.

FIG. 5 is an exemplary key assembly 500 including a stationary key guide 502 and a movable key cap 504 configured to be pressed downwardly generally along an arrow 514 by an input object 506 (e.g., a finger). The key assembly 500 includes a finger presence sensor 522 and a keystroke sensor 520 mounted to a substrate 532 underneath the key assembly. The finger presence sensor 522 may be in the form of an electrode pair including a transmitter electrode 524 and a receiver electrode 526. Similarly, the keystroke sensor 520 may be in the form of an electrode pair including a transmitter electrode 528 and a receiver electrode 530.

The key cap 504 includes a first conductive portion 510 and a second conductive portion 512. The key guide 502 includes a third conductive portion 508. The first conductive portion 510 and the third conductive portion 508 cooperate magnetically to provide tactile feedback to the user when pressing on the key cap 504, in the form of an initial resistance to be overcome by the input object 506 during a keystroke. The first conductive portion 510 and the third conductive portion 508 also magnetically interact to provide a restoring force, to return the key cap 504 to the nominal position shown in FIG. 5 following a keystroke.

In an embodiment, the first conductive portion 510 and the third conductive portion 508 are magnets. Alternatively, one of the first conductive portion 510 and the third conductive portion 508 may be a magnet, with the other being made of a ferromagnetic material.

The keystroke sensor 520 capacitively interacts with the first conductive portion 510, and the finger presence sensor 522 capacitively interacts with the second conductive portion 512 during a key stroke, as described below in conjunction with FIG. 6.

Figure 6:
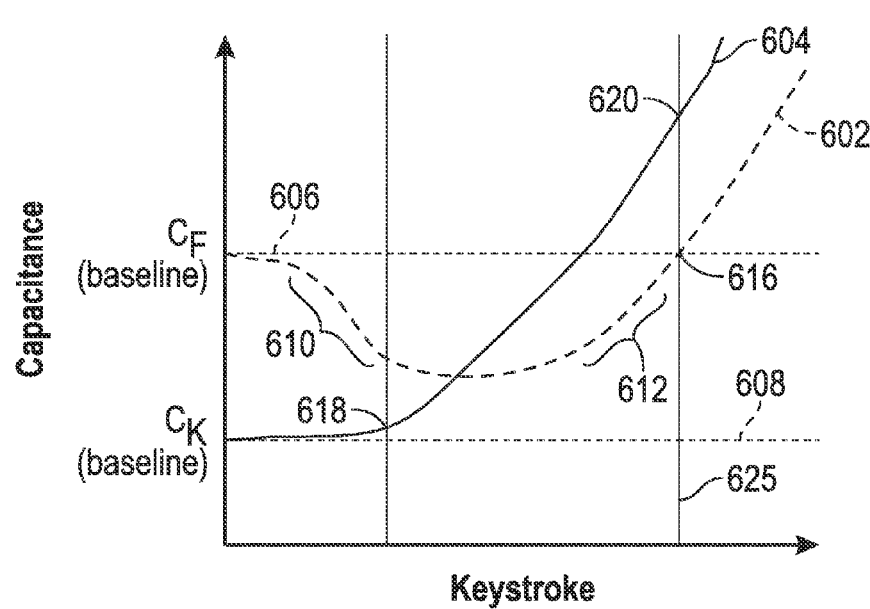
FIG. 6 is a graph of a first signal representing the variable capacitance of the finger presence sensor of FIG. 5 versus a downward keystroke, superimposed upon a second signal representing the variable capacitance of the keystroke sensor of FIG. 5 versus a downward keystroke in accordance with the techniques described herein.

With reference to FIGS. 5 and 6, FIG. 6 is a graph 600 of a first signal 602 representing the output of the finger presence sensor 522 in response to a downward keystroke, superimposed upon a second signal 604 representing the output of the keystroke sensor 520 in response to a downward keystroke. A dotted line 606 represents an exemplary baseline output level from the finger presence sensor 522, and a dotted line 608 represents an exemplary baseline output level from the keystroke sensor 520. In this context, the baseline output level refers to the output signal value with no finger present on the key cap.

In the illustrated embodiment, the second conductive portion 512 may be configured to electrically float; that is, the second conductive portion 512 is preferably not grounded or maintained a constant voltage potential.

With continued reference to FIGS. 5 and 6, the signal 602 represents the variable capacitance between the transmitter electrode 528 and the receiver electrode 530 of the finger presence sensor 522. With no finger present, the finger presence sensor outputs the baseline value 606. The signal 602 dips below the baseline value 606, represented by a decreasing segment 610 of the signal 602, when a grounded input object (e.g., a finger) contacts the key cap 504. This is due to the capacitive coupling between the grounded finger and the floating conductor 512, which together draw field lines from the finger presence sensor 512 which would otherwise capacitively couple the transmitter electrode 528 to the receiver electrode 530.

As the key cap 504 is urged downwardly during a keystroke, the floating conductor 512 approaches the finger presence sensor 512 and thereby increases the capacitive coupling between the transmitter electrode 528 and the receiver electrode 530, as indicated by the increasing segment 612 of the signal 602. The signal continues to increase monotonically as the key cap 504 (and the second conductive portion 512) moves closer to the finger presence sensor 522, intersecting the baseline value 606 at a crossing point 616 corresponding to a downward keystroke position 625. Notably, the finger presence sensor 522 outputs the baseline value 606 both: i) when no finger is present; and ii) when the key cap 504 is at the position 625. As discussed above, this results in an ambiguity inasmuch as the finger presence sensor 522, acting alone, is limited in its ability to distinguish between the position 625 and the condition in which no finger is present.

With continued reference to FIGS. 5 and 6, the signal 604 represents the variable capacitance between the transmitter electrode 524 and the receiver electrode 526 of the keystroke sensor 520. When the key cap 504 is in the nominal position shown in FIG. 5, the keystroke sensor 520 outputs the baseline value 608. As the key cap 504 is initially pressed downwardly, the third conductor 508, which is typically grounded or otherwise maintained at a constant voltage potential, approaches the keystroke sensor 520. The signal 604 increases monotonically with a downward keystroke, to a value 620 when the key cap 504 is at the position 625. Accordingly, the second signal 604 may be used to disambiguate the first signal 602.

More particularly, if the output signal 602 of the finger presence sensor 522 is at its baseline value 606 and the output signal 604 of the keystroke sensor 520 is also at or near its baseline value 608, the system reports that no finger is present on the key. Alternatively, if the output signal 602 of the finger presence sensor 522 is at its baseline value 606 at position 616, and the output signal 604 of the keystroke sensor 520 is substantially above its baseline value 608, the system reports that a finger is present on the key.

In accordance with various embodiments, the hardware for detecting finger presence may be efficiently implemented in the context of a keyboard having key assemblies which include a key cap configured to magnetically interact with a key guide to provide a return mechanism following a keystroke. In particular, the magnetic element associated with the key cap may be used to sense keystroke motion using an electrode pair positioned underneath the key cap. The keystroke electrode pair may share either a transmitter or receiver electrode with the electrode pair used to detect finger position, thereby minimizing the total number of electrodes needed to implement both the keystroke sensor pixels and the finger presence pixels.

Figure 7:
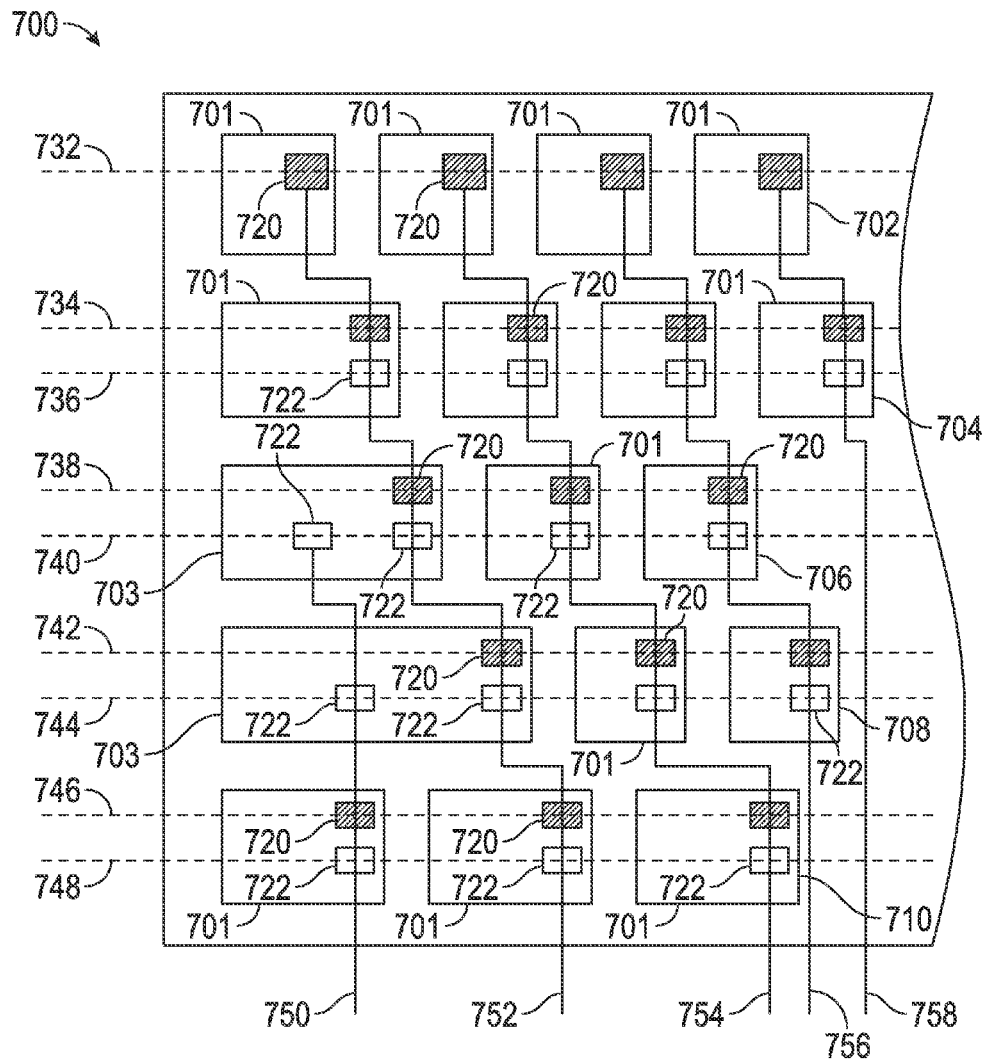
FIG. 7 is a schematic layout diagram of a portion of a keyboard including standard keys and wide keys, overlaid with a matrix of finger presence pixels, keystroke motion pixels, and their associated interconnections in accordance with the techniques described herein.

Referring now to FIG. 7, a portion of a keyboard 700 includes a plurality of standard keys 701 and a plurality of wide keys 703, a matrix of keystroke motion pixels 720 and finger presence pixels 722, and their associated interconnections (conductors) 732-758. More particularly, keyboard 700 includes a first row 702, a second row 704, a third row 706, a fourth row 708, and a fifth row 710, although the keyboard may include any number of rows of keys. Alternatively, the keys may be arranged in any desired manner in addition to or other than in the form of rows. It will be appreciated that the keystroke motion pixels 720 generally correspond to the keystroke sensor 520 (shown in FIG. 5), and that the finger presence pixels 722 generally correspond to the finger presence 522.

One or more of the rows may include one or more "standard" keys 701 and one or more "wide" keys 703. In this context, a standard key generally refers to a key assembly which includes less than two finger presence pixels, and a wide key generally refers to a key assembly which includes two or more finger presence pixels. In this way, in addition to detecting finger presence, a wide key may also detect directional motion of an input object on the key surface using two or more finger presence sensors (pixels).

In the embodiment shown in FIG. 7, the conductor 732 interconnects the keystroke pixels 720 in row 702, the conductor 734 interconnects the keystroke pixels 720 in row 704, the conductor 738 interconnects the keystroke pixels 720 in row 706, the conductor 742 interconnects the keystroke pixels 720 in row 708, and the conductor 746 interconnects the keystroke pixels 720 in row 710. The conductor 736 interconnects the finger presence pixels 722 in row 704, the conductor 740 interconnects the finger presence pixels 722 in row 706, the conductor 744 interconnects the finger presence pixels 722 in row 708, and the conductor 748 interconnects the finger presence pixels 722 in row 710.

With continued reference to FIG. 7, the conductor 750 interconnects the second finger presence pixels associated with the wide keys 703 in rows 708 and 706, respectively, as well as the finger presence and keystroke pixels associated with the left-most standard key 701 in row 710. The conductor 752-758 interconnect the respective keystroke pixels 720 and finger presence pixels 722 in the adjacent "columns" of keys, although it will be appreciated that these columns may or may not be vertically aligned. In the illustrated embodiment, the horizontal conductors 732-748 comprise transmitter electrodes, and the substantially vertical conductors 750-758 comprise receiver electrodes. Alternatively, virtually any configuration of transmitter and receiver electrodes may be used to implement the matrix of keystroke and finger presence pixels while minimizing (or otherwise optimizing) hardware resources.

In various embodiments it may be desirable to illuminate the key caps from underneath to highlight one or more identifying indicia (e.g., alpha-numeric characters) associated with each key. In one embodiment, the transmitter and/or receiver electrodes comprising the finger presence and/or keystroke sensors may be made from a transparent conductive material to facilitate light transmission through the key cap. However, transparent conductive materials are typically expensive. Alternatively, the transmitter and receiver electrodes comprising the keystroke and finger presence sensors may be configured (e.g., geometrically) to effectively capacitively couple with their corresponding ferromagnetic elements (See, FIG. 5), while at the same time still allowing sufficient light transmission around the electrode and through the top of the key cap.

Figure 8:
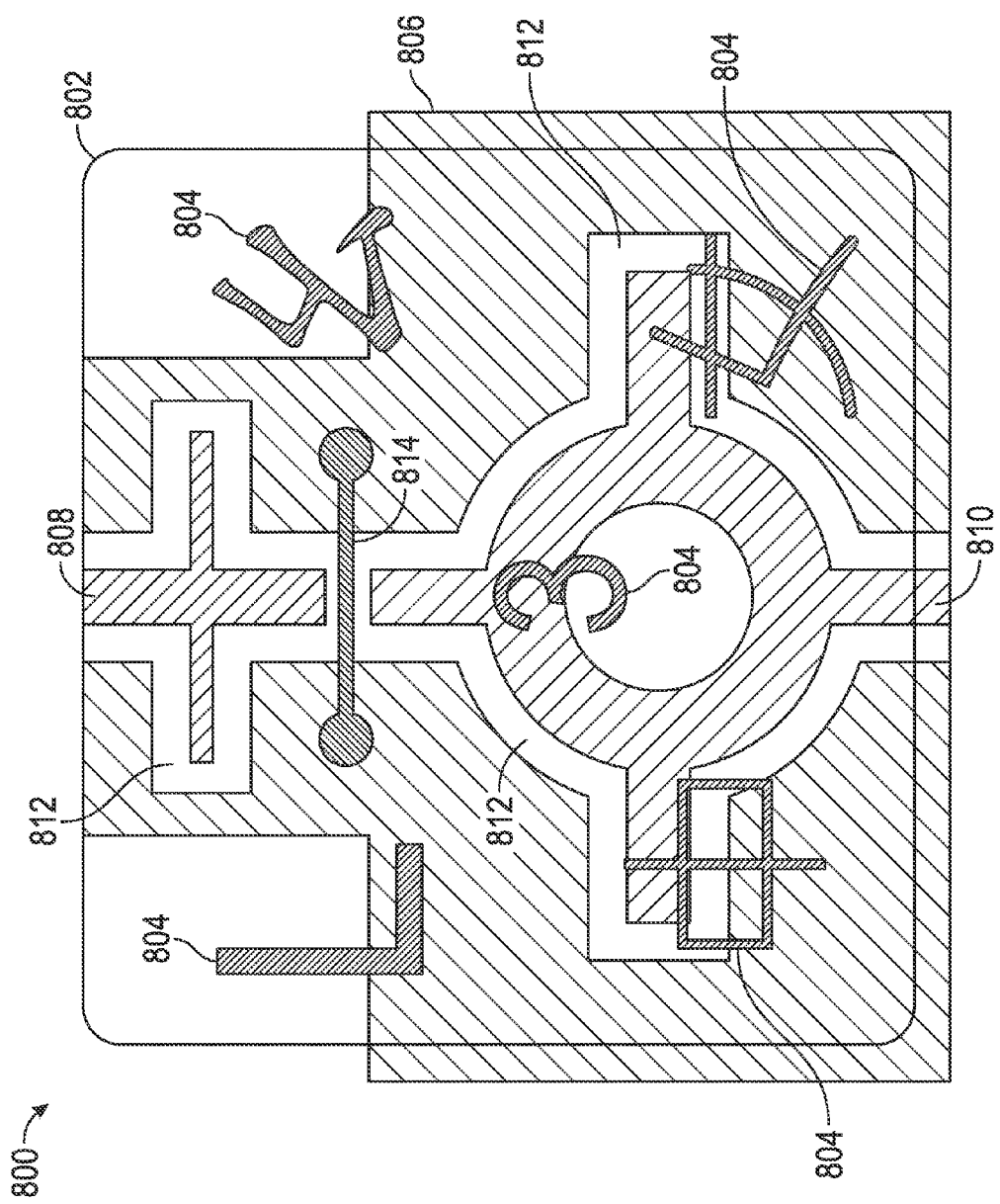
FIG. 8 is a schematic diagram of an exemplary layout of a single transmitter electrode and respective keystroke and finger presence receiver electrodes in accordance with the techniques described herein.

More particularly and referring now to FIG. 8, a schematic layout diagram of an exemplary key assembly 800 includes key cap 802 having one or more identifying characters 804 printed, painted, patterned, or otherwise adhered to the top of the key. The key assembly 800 also includes a patterned transmitter 804, which may comprise symmetric portions joined by a conductive bridge 814, a patterned keystroke receiver electrode 808, and a patterned finger presence receiver electrode 810. The various electrodes are configured to allow light from below the plane of the electrodes to pass upwardly through various spaces 812 between the electrodes to thereby illuminate the key caps.

A keyboard is thus provided which includes a plurality of key assemblies configured to be pressed by an input object. A subset of the plurality of key assemblies each includes: a key cap; a first electrode pair disposed underneath the key cap and configured to detect key motion in response to downward force applied by the input object; and a second electrode pair disposed underneath the key cap and configured to detect positional information about the input object interacting with the key cap. The positional information may include one or more of: a binary indication of the presence or absence of the input object on the key cap; the location of the input object on a surface of the key cap; and motion of the input object on the key cap.

In an embodiment, the first and second electrode pairs are capacitive sensing electrodes.

In an embodiment, the subset of key assemblies comprises at least one wide key cap, and at least two of the second electrode pairs are disposed underneath the at least one wide key cap.

In an embodiment, the at least two of the second electrode pairs are configured to detect directional motion of the input object interacting with the at least one wide key cap.

In an embodiment, the key cap comprises a first conductive portion, and the first electrode pair comprises a first transmitter and a first receiver configured to detect keystroke motion based on at least one of: a change in capacitance between the first electrode pair and the first conductive portion; and a change in capacitance between the first conductive portion and a variable capacitance between the first transmitter and the first receiver.

In an embodiment the first conductive portion comprises a ferromagnetic material.

In an embodiment the first electrode pair may be configured to generate a first signal, the second electrode pair may be configured to generate a second signal, and the positional information may be determined based on the first and second signals, and the first signal may be used to disambiguate the second signal.

In an embodiment the key cap comprises a second conductive portion, and the second electrode pair comprises a second transmitter and a second receiver configured to detect positional information based on at least one of: a change in capacitance between the second electrode pair and the input object; a change in capacitance between the second electrode pair and the second conductive portion; and a change in capacitance between the second conductive portion and a variable capacitance between the second transmitter and the second receiver.

In an embodiment the key cap comprises a top surface and a bottom surface, and the second conductive portion may be affixed to the bottom surface and spaced apart from the second transmitter and the second receiver.

In another embodiment, a second subset of the key assemblies are arranged in a substantially horizontal row, and a first conductor extends across the row and electrically interconnects one of the first and second electrode pairs in the row.

In a further embodiment a second conductor extends across the row and electrically interconnects the other one of the first and second electrode pairs in the row.

In another embodiment, at least one of the first and second conductors is configured to connect a plurality of transmitter electrodes.

In a further embodiment, a plurality of the second electrode pairs each comprise a receiver electrode substantially surrounded by a spatially distributed transmitter electrode.

A processing system is also provided for a keyboard input device of the type which includes a plurality of keys configured to be pressed by an input object, a first plurality of capacitive sensor electrodes disposed underneath the keys, and a second plurality of capacitive sensor electrodes disposed underneath at least a subset of the keys. The processing system may be configured to: determine a keystroke signal from the first plurality of sensor electrodes; determine a finger presence signal from the second plurality of sensor electrodes; and determine positional information for the finger based on the keystroke signal and the finger presence signal.

In an embodiment, the first and second pluralities of capacitive sensor electrodes comprise a first transmitter and a first receiver sensor electrode, and the processing system is configured to: determine the keystroke signal based on a received signal on a first receiver sensor electrode of the first plurality; and determine the finger presence signal from a first receiver sensor electrode of the second plurality.

A method is also provided for detecting positional information of a finger interacting with a keyboard key of the type including a keystroke sensor configured to output a keystroke signal and a finger presence sensor configured to output a finger presence signal. The method includes: determining a first baseline value associated with the keystroke signal; determining a second baseline value associated with the finger presence signal; determining whether the finger presence signal substantially corresponds to the second baseline value; and determining positional information for the finger based on the finger presence signal and the keystroke signal.

In an embodiment the method also includes disambiguating the finger presence signal using the keystroke signal.

In an embodiment the positional information comprises at least one of: binary indication of the presence or absence of the finger on the key; the location of the finger on a surface of the key; and motion of the finger on the key.

Thus, the techniques described herein can be used to implement any number of devices utilizing different touchsurface assemblies, including a variety of keyboards each comprising one or more key assemblies in accordance with the techniques described herein. Some components may be shared when multiple touchsurfaces are placed in the same device. For example, the base may be shared by two or more touchsurfaces. As another example, the keyswitch sensor may be shared through sharing sensor substrates, sensor electrodes, or the like.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer. As a second specific example, ferrous material may be used to replace magnets in various magnetically coupled component arrangements.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions. Thus, the techniques described in the various implementations herein may be used in conjunction with each other, even where the function may seem redundant. For example, some embodiments use springs to backup or augment magnetically-based ready/return mechanisms.

What is claimed is:

1. A keyboard including a plurality of key assemblies configured to be pressed by an input object, wherein a first subset of the plurality of key assemblies each comprises:
   a key cap;
   a first conductive portion disposed on the key cap, wherein the first conductive portion is configured to operate at a substantially constant voltage;
   a second conductive portion disposed on the key cap, wherein the second conductive portion is an electrically floating conductor;
   a base;
   a first electrode pair disposed underneath the key cap and on the base, the first electrode pair configured to generate a keystroke signal in response to movement of the first conductive portion on the key cap toward the base by the input object; and
   a second electrode pair disposed underneath the key cap and on the base, the second electrode pair configured to generate a finger presence signal in response to a change in capacitive coupling between a finger and the second conductive portion at the key cap,
   wherein the finger presence signal with no finger present at the key cap corresponds to a baseline value of the finger presence signal, and
   wherein the keystroke signal is used by a processing system to determine that the key cap is in a pressed position when the keystroke signal is above the baseline value.

2. The keyboard of claim 1, wherein the first and second electrode pairs comprise capacitive sensing electrodes.

3. The keyboard of claim 1, wherein the subset of key assemblies comprises at least one wide key cap, and wherein a plurality of electrode pairs are disposed underneath the at least one wide key cap.

4. The keyboard of claim 3, wherein the plurality of electrode pairs are configured to detect directional motion of the input object interacting with the at least one wide key cap.

5. The keyboard assembly of claim 3, wherein the plurality of electrode pairs each comprise a receiver electrode substantially surrounded by a spatially distributed transmitter electrode.

6. The keyboard of claim 1, wherein the first electrode pair comprises a transmitter electrode and a receiver electrode configured to detect keystroke motion based on at least one of:
   a change in capacitance between the first electrode pair and the first conductive portion; and
   a change in capacitance between the first conductive portion and a variable capacitance between the transmitter electrode and the receiver electrode.

7. The keyboard assembly of claim 6, wherein the first conductive portion comprises a ferromagnetic material.

8. The keyboard of claim 1, wherein the second electrode pair comprises a transmitter electrode and a receiver electrode configured to detect positional information based on at least one of:
   a change in capacitance between the second electrode pair and the input object;
   a change in capacitance between the second electrode pair and the second conductive portion; and
   a change in capacitance between the second conductive portion and a variable capacitance between the transmitter electrode and the receiver electrode.

9. The keyboard of claim 8, wherein the positional information comprises at least one of: a binary indication of the presence or absence of the input object on the key cap; a location of the input object on a surface of the key cap; and motion of the input object on the key cap.

10. The keyboard of claim 8, wherein the first electrode pair is configured to generate a first signal, the second electrode pair is configured to generate a second signal, and further wherein the positional information is determined based on the first and second signals.

11. The keyboard of claim 10, wherein the first signal is used to disambiguate the second signal.

12. The keyboard of claim 8, wherein the key cap comprises a top surface and a bottom surface, and wherein the second conductive portion is affixed to the bottom surface and spaced apart from the transmitter electrode and the receiver electrode.

13. The keyboard of claim 1, wherein a second subset of the key assemblies are arranged in a substantially horizontal row, and wherein the first conductive portion extends across the substantially horizontal row and electrically interconnects one of the first and second electrode pairs in the substantially horizontal row.

14. The keyboard of claim 13, wherein the second conductive portion extends across the substantially horizontal row and electrically interconnects the other one of the first and second electrode pairs in the substantially horizontal row.

15. A processing system for a keyboard input device of a type including a plurality of key assemblies configured to be pressed by an input object, the processing system configured to:
   determine a keystroke signal from a first plurality of sensor electrodes, wherein the first plurality of sensor electrodes are disposed on a base of a key cap among the plurality of key assemblies, wherein the keystroke signal changes in response to movement of a first conductive portion operating at a substantially constant voltage and disposed on the key cap towards the base;
   determine a finger presence signal from a second plurality of sensor electrodes, wherein the finger presence signal changes in response to a change in capacitive coupling between a finger at the key cap and a second conductive portion disposed on the key cap, and wherein the second conductive portion is an electrically floating conductor; and
   determine, in response to determining that the keystroke signal is above a baseline value, that the key cap from the plurality of key assemblies is in a pressed position, wherein the baseline value corresponds to the finger presence signal with no finger present at the key cap.

16. The processing system of claim 15, wherein the first plurality of sensor electrodes and the second plurality of sensor electrodes comprise a transmitter electrode and a receiver electrode, and wherein the processing system is configured to:
   determine the keystroke signal based on a received signal from the receiver electrode; and
   determine the finger presence signal using the received signal.

17. A method of detecting positional information of a finger interacting with a keyboard key of the type including a keystroke sensor and a finger presence sensor, the method comprising:
   obtaining a keystroke signal from the keystroke sensor, wherein the keystroke signal changes in response to movement of a first conductive portion disposed on a key cap of the keyboard key toward a base, wherein the first conductive portion is configured to operate at a substantially constant voltage;
   obtaining a finger presence signal from the finger presence sensor, wherein the finger presence signal changes in response to a change in capacitive coupling between the finger and a second conductive portion disposed on the key cap, wherein the second conductive portion is an electrically floating conductor;
   determining a first baseline value associated with the keystroke signal, wherein the first baseline value corresponds to the keystroke signal of an unpressed keyboard key;
   determining a second baseline value associated with the finger presence signal, wherein the second baseline value corresponds to the finger presence signal with no finger present at the keyboard key;
   determining whether the keystroke signal is above the second baseline value; and
   determining, in response to determining that the keystroke signal is above the second baseline value, that the keyboard key is in a pressed position.

18. The method of claim 17, further comprising disambiguating the finger presence signal using the keystroke signal.

19. The method of claim 17, wherein the positional information comprises at least one of: a binary indication of the presence or absence of the finger on the keyboard key; a location of the finger on a surface of the key cap; and motion of the finger on the keyboard key.

\* \* \* \* \*